MAGNETO-SEMICONDUCTOR DEVICES

Filed Aug. 6, 1962 2 Sheets-Sheet 1

INVENTORS.
IVARS MELNGAILIS
ARTHUR R. CALAWA
ROBERT H. REDIKER
BY
Edward D Thomas
AGENT INVENTORS.
IVARS MELNGAILIS
ARTHUR R. CALAWA
ROBERT H. REDIKER
BY
Edward D. Thomas
AGENT 3,167,663

MAGNETO-SEMICONDUCTOR DEVICES

Ivars Melngailis, Cambridge, Arthur R. Calawa, Chelmsford, and Robert H. Rediker, Newton, Mass., assignors to Massachusetts Institute of Technology, Cambridge, Mass., a corporation of Massachusetts Filed Aug. 6, 1962, Ser. No. 215,007
17 Claims. (Cl. 307—88.5)

This invention relates to a class of active devices having an electromagnet input and a semiconductor output and whose operation is based on the magnetic deflection and deformation of a solid state injection plasma.

Since the principle of operation can be used to advantage in a variety of semiconductor geometries and contact arrangements, the word "madistor" will be use as a generic term for the class, and where it becomes necessary to differentiate between different semiconductor output arrangements, the output description will be used to modify the word "madistor" (i.e. diode madistor, dual base madistor, etc.).

Recent studies have indicated that certain semiconductor diodes possessing a large ratio of diode thickness to minority carrier diffusion length exhibit a dependence of forward current to diffusion length such that a decrease in the latter leads to a decrease in current flow. In these studies, the observed decrease of current in a strong magnetic field was explained by the action of a magnetic field to deflect the carrier path, thus to decrease the mobility, and decrease the diffusion length. Reference may be made to a paper by V. I. Stafeev, Soviet Physics-Solid State, 1, 763 (1959) and a paper by Karakushan et al., Soviet Physics-Solid State, 3, 493 (1961) for a more complete account of magnetic effects in germanium diodes. Calawa et al., Physical Review Letters, 5, 55 (1960) and Rediker et al., J.A.P., 32, 2189 (1961) describe observations on the effect of magnetic fields applied to indium-antimonide and lead-telluride tunnel diodes to reduce tunnel current.

The property of a diode by which the current flow can be changed by the application of an external magnetic field has attractive possibilities. If a time varying signal is used to modulate the magnetic field intensity which in turn modulates the diode forward current, the phenomenon can be useful for amplification in the event that the output power is greater than the input power and the circuit will possess the properties of a four terminal network in which the load on the output does not change the input characteristics. However, the reported data require magnetic fields in the thousands of gauss to obtain significant change of diode current. This greatly limits the feasibility of the device because the electomagnets required to produce these fields can operate only at very low frequencies.

We have discovered the $n^+p$ indium antimonide diodes can be operated at the temperature of liquid nitrogen under conditions such that a solid state injection plasma is produced. It is, therefore, a primary object of the invention to make use of the effect of a magnetic field on the properties of an injection plasma in diodes with forward current-voltage characteristics which are very sensitive to magnetic fields and thus to extend the useful frequency range of four terminal magnetic-input semiconductor-output devices.

W. W. Tyler, Physical Review, 96, 226 (1954) and A. S. Lebedev et al., J. Tech. Phys. (USSR) 26, 1419 (1956) have observed for Fe doped germanium and Au doped germanium diodes respectively, both at the temperature of liquid nitrogen, an abrupt drop in voltage and a region of negative résistance. We have discovered that in appropriately designed diodes the production of a solid state injection plasma brings about a negative resistance region in the forward current-voltage characteristics of the diode. It is, therefore, a further object of this invention to improve the negative resistance region of semiconductor diodes both per se for simple diode bistable operation and to improve magnetic sensitivity.

These and other features and objects of the invention will be more fully understood from the following detailed description and by reference to the accompanying drawings of which:

Diode madistor amplifiers can be built by mounting diodes either inside small air-core solenoids or in air gaps cut in small ferro-magnetic toroids. The air core solenoids are preferred if absolute linearity of response is required, and hysteresis and eddy current losses cannot be tolerated. With ferromagnetic toroids the magnetic field is readily limited to the volume of the diode mounted in the air gap and the reluctance of the magnetic circuit is smaller than the reluctance of an equivalent air core solenoid; fewer ampere-turns are needed to produce a given magnetic field, and the inductance of the input circuit is reduced.

Figure 1:
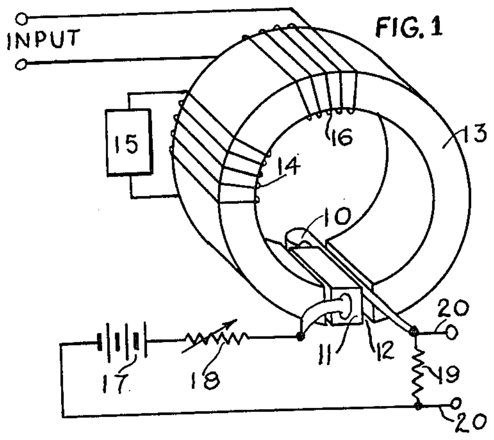
FIGURE 1 illustrates the basic circuit of the invention with the diode madistor shown in perspective.

With reference to FIGURE 1, a p-type indium antimonide diode 11 is shown mounted in the air gap 12 of a toroidal core 13 of magnetic material. A D.C. source 17 is used to bias diode 11 to a desired value of forward current flow by adjustment of variable resistor 18. The diode circuit is completed through load resistor 19, the output signal line 20 being connected across resistor 19. Coil 14 is wound on core 13 and a D.C. bias is applied to it from power supply 15. This produces a biasing magnetic field in air gap 12 of a particular value to which diode 11 is subjected, diode 11 being oriented in gap 12 so that the magnetic field is transverse to the direction of current flow in the semiconductor material of the diode. Although an input signal can be coupled directly to coil 14, a second coil 16 is shown wound on core 13 and connected to receive the input signal. The electromagnet core 13 and coil 14 as well as diode 11 are considered to be immersed in a liquid nitrogen bath (not shown) for operation at the temperature of 77° K.

Figure 2:
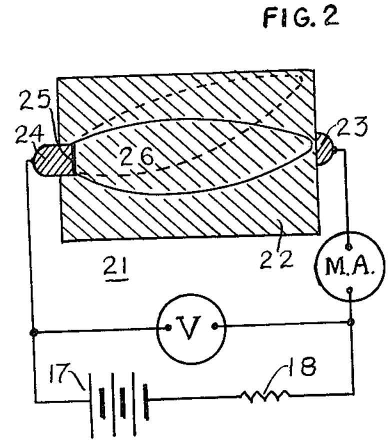
FIGURE 2 is a cross section of the diode of FIGURE 1.
Figures 4A, 4B:
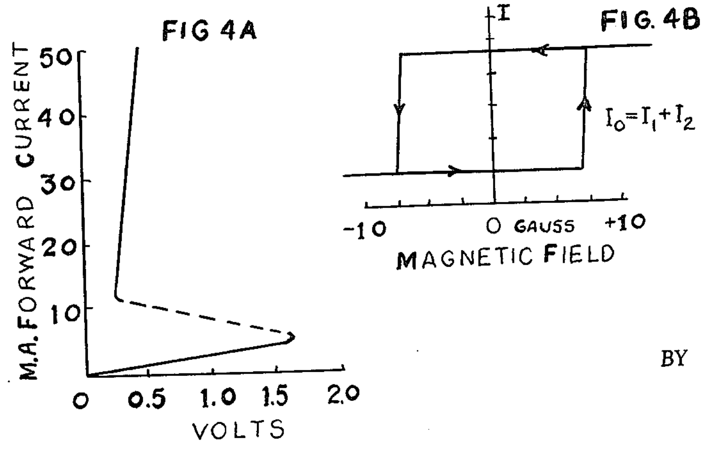
FIGURE 4A is a plot of forward current versus voltage for the diode of FIGURE 2.
FIGURE 4B is a plot of current in contact *23a* versus applied magnetic field for the diode of FIGURE 3C.

Referring to FIGURE 2, by way of example, a diode 21 is made with a bar-shaped base region 22 of 40 ohm-cm. p-type InSb with a 0.5 mm. square cross section and a length of 1.0 mm., and an ohmic contact 23 is placed at one end and contact 24, making an n-p junction 25, is at the opposite end. At 77° K. and at low current flow, the diode resistance which is in the main due to the resistance in the base region is high. Due to the presence of minority carrier traps, which cause electron lifetimes in p-type InSb at 77° K. to be as short as $10^{-10}$ sec. at low injection levels, the minority carriers are unable to diffuse into the base region from the rectifying junction 25 and modulate this base region resistance. As the current is increased, as by adjustment of resistor 18, traps eventually become saturated by the increased density of injected carriers, the lifetime is increased by several orders of magnitude and conductivity modulation of the base takes place. This results in the formation of an injection plasma in the base 22 between the rectifying junction contact 24 and the ohmic contact 23. The injection plasma forms in a region 26 of increased carrier lifetime and low resistance. The formation of the plasma brings about an abrupt drop in voltage across the diode and a region of negative resistance as shown in FIGURE 4A. For the particular diode illustrated, the junction current density at breakdown is 0.8 amp. $cm.^{-2}$.

We have observed a negative resistance region for diodes in which the resistivity of the p-type base is as low as 4 ohm-cm. at 77° K. For identical geometry the negative resistance is larger for higher base resistivities and lower temperatures. Negative resistance regions have been observed for temperatures up to 100° K. and diodes have been operated between 4° K. and 100° K. The operating temperature of liquid nitrogen (77° K.) has been mostly used for convenience only. The range from 30 to 100 ohm-cm. base resistivity seems best suited for the circuit of FIGURE 1, since below 30 ohm-cm. the effects are smaller and above 100 the phenomenon becomes obscured and complicated by other factors which are not significant within the selected range.

The injection plasma occupies a zone or region within the base material which grows as the current is increased. As the plasma propagates down the bar, the negative resistance as measured by probes along the bar also propagates down the bar. The "breakdown" at any point in the base does not occur at a critical value of current density or electric field, but rather seems to depend on the density of injected carriers. Injection of minority carriers by exposure to white light or infrared radiation of any wavelength below 56,000 A. has the effect of increasing the prebreakdown conductance and reducing greatly the breakdown voltage.

Figure 5:
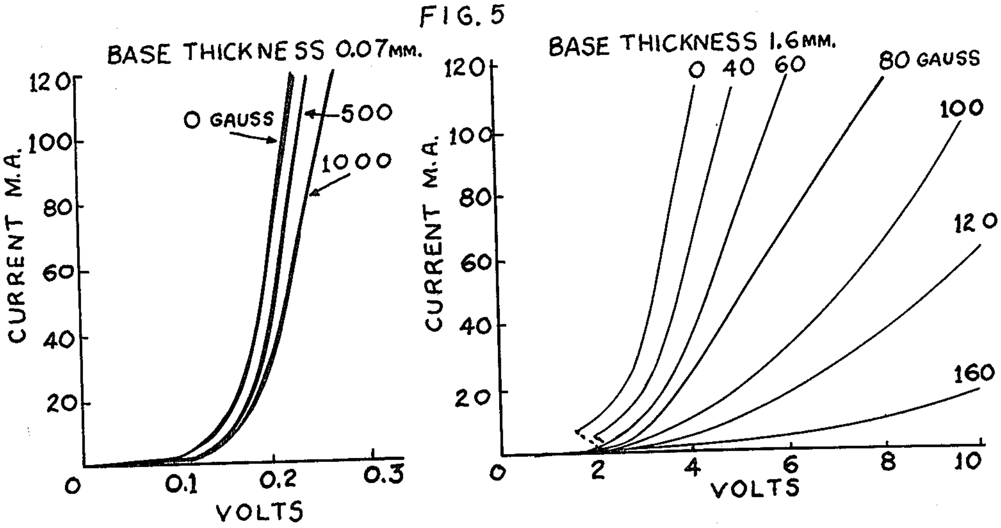
FIGURE 5 is a graphical representation of the effect of changing diode thickness on the magnetic effect on current flow.

If a transverse magnetic field perpendicular to the plane of the drawing is applied to the diode 21 when it is operated in the region of high current flow, the injected carriers are deflected, resulting in a lateral displacement of the plasma, shown by dotted lines in FIGURE 2. Depending on the shape of the base region 22 and the field strength, the carriers may be deflected to the surface or to surrounding regions of low lifetime away from contact 23. In both cases the effective carrier lifetime is reduced. As a consequence of these processes, the resistance of the base region is greatly increased. On the basis that the carrier lifetime in the base material is reduced thereby reducing the minority carrier diffusion length, the increased resistance of the diode in the presence of a magnetic field is a phenomenon of the base region and the amount of change is related to diode base thickness. This is demonstrated by reference to FIGURE 5. The data for FIGURE 5 was taken for two diodes made of the same 4 ohm-cm. p-type InSb. In the very thin base diode the magnetic effect is small and the negative resistance effect vanishes. In the thick base diode, a small negative resistance is found and a considerable resistance change occurs at relatively low magnetic fields.

Figure 6:
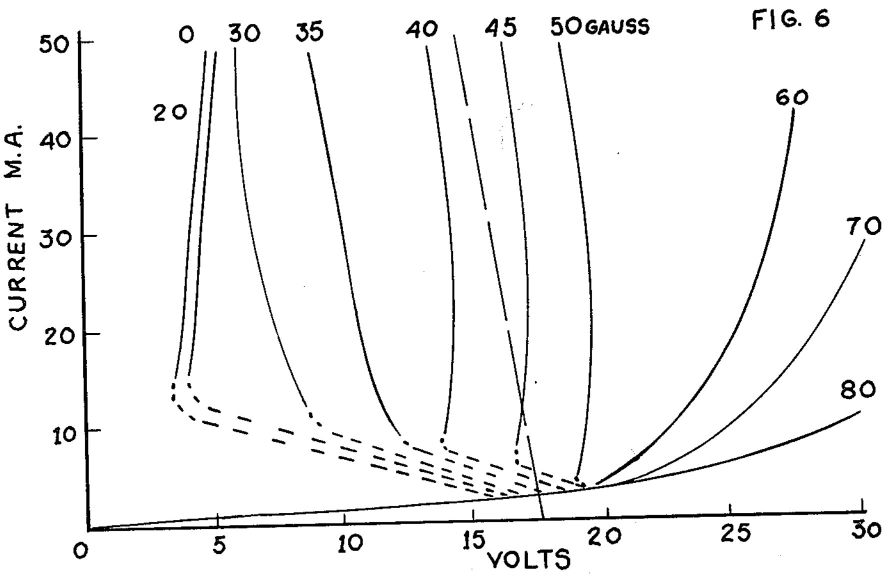
FIGURE 6 is a graphical representation of the effect of magnetic fields on the forward current-voltage characteristic of a diode showing negative resistance properties.

A diode made with a bar shaped base region 1.5 x 0.5 x 0.5 mm. of 40 ohm-cm. resistivity at 77° K. has been found to have a current-voltage characteristic exhibiting a substantial negative resistance and to be extremely sensitive to magnetic fields perpendicular to the direction of current flow in the base region. As can be seen from FIGURE 6, the magnetic field greatly increases the resistance after breakdown. If the device is operated at a quiescent magnetic field of 40 gauss and a load line as shown in dashed lines, the application of only 5 additional gauss will change the current flow by more than 40 milliamperes.

Figure 3A:
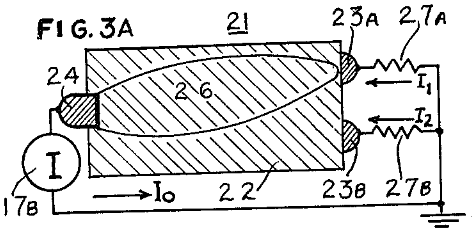
FIGURES 3A through 3D show in cross section various modifications of the invention.
Figure 3B:
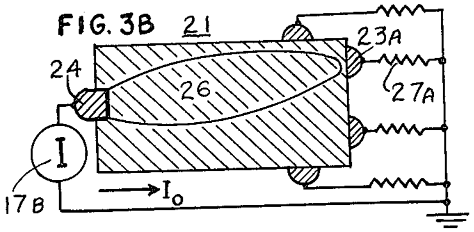

The operation of the diode madistor has been described in detail here because of its structural simplicity. However, the effects of a magnetic field on an injection plasma can be made use of in a variety of more complicated structures which may be of more importance for various special applications than the simple diode. For example, the single $p^+$ ohmic contact 23 of the diode in FIGURE 2 can be replaced by two $p^+$ contacts, 23*a* and 23*b*, as shown in FIGURE 3A. A forward current $I_0$ from a direct current source 17*b* is passed through the diode 21 and divides between the ohmic contacts if no magnetic field is applied. With a magnetic field perpendicular to the plane of the drawing the injection plasma 26 is deflected toward one of the ohmic contacts, 23*a* as shown. Consequently, there is an increase of current $I_1$ through 23*a* and resistor 27*a* and a decrease of current $I_2$ through 23*b* and resistor 27*b*, the total current adding up to $I_0$, $I_1+I_2=I_0$, reversal of the direction of the field serving to shift the plasma toward contact 23*b*. This principle of deflecting the plasma between contacts can be extended to a large variety of multi-contact structures, illustrated in FIGURE 3B, and it provides another possibility for amplification and switching devices.

Figure 3C:
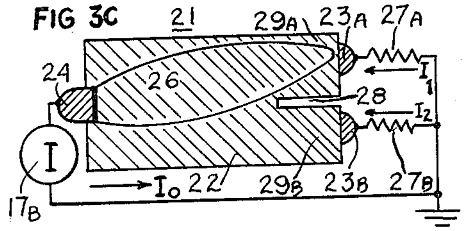

In addition, bistable magnetic switching has been obtained by use of the dual base structure of FIGURE 3C. Here a longitudinal slit 28 has been cut between the ohmic contacts 23*a* and 23*b*. The purpose of the slit 28 is to eliminate carrier diffusion between regions near the two contacts. This can also be accomplished by enough spacing between contacts 23*a* and 23*b*. Once the injection plasma is established in one of the legs 29*a*, as shown, the voltage between contacts 24 and 23*b* in leg 29*b* is too low to cause injection breakdown in leg 29*b*, because of the bistable characteristic (FIGURE 4A) associated with the formation of the injection plasma so that after the magnetic field is removed leg 29*b* will remain in the high impedance state and the current will remain in leg 29*a*. However, by applying a magnetic field perpendicular to the plane of the paper the plasma can be deflected from leg 29*a* into leg 29*b*. After removing the magnetic field, the plasma will now remain in leg 29*b* and leg 29*a* will be in the high impedance state with most of the current passing from contact 24 to contact 23*b*. A magnetic field of opposite polarity is required to move the plasma back to leg 29*a*. FIGURE 4B shows the current ($I_1$) in one of the $p^+$ contacts as a function of magnetic field. This device has the features of a flip-flop because it provides for bistable switching by means of pulses applied to a magnetic input coil. The advantages of such a flip-flop circuit are an isolated input and a simplicity of operation which eliminates the necessity of additional circuit elements required in vacuum tube and transistor flip-flops.

Figure 3D:
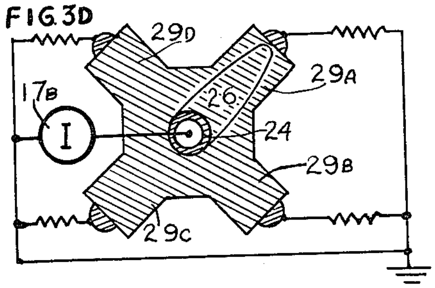

A further extension of this structure would be a multi-leg device shown in FIGURE 3D, in which a number of legs 29*a*–29*d* surround a centrally located p-n junction 24. The magnetic field again is applied perpendicular to the plane of the paper. The amplitude and duration of switching pulses are adjusted so that every input pulse advances the plasma 26 by any desired number of legs, i.e., the device performs as a stepping switch or ring counter.

Figure 7:
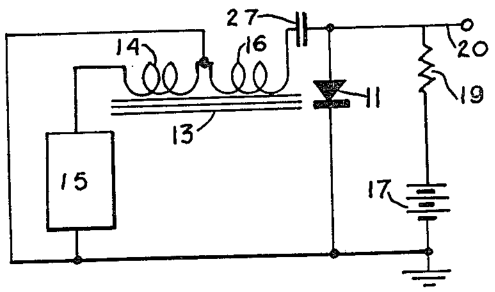
FIGURE 7 illustrates a modification of the circuit of FIGURE 1 to produce oscillations.

FIGURE 7 gives a schematic diagram showing a modification of FIGURE 1 to produce sustained oscillations. In this case, capacitor 27 is used as a feed back loop from the output line 20 to coil 16 of the electromagnet generally indicated as core 13. Coil 14 is biased from D.C. power supply 15 to produce a suitable biasing field to which diode 11 is subjected. For a diode having the characteristics shown in FIGURE 6, a biasing field of the order of 40–45 gauss might be chosen. The circuit of FIGURE 7 has been found to operate at frequencies as high as 450 kc., the frequency being dependent upon the impedance of the magnetic field coil, the time constants of the load and the size of capacitor 27. This demonstrates that power gain can be obtained with the circuit of FIGURE 1 at least over the same frequency range. Once amplification and oscillation are demonstrated, a wide variety of circuit variations including multivibrators, flip-flops and switching circuits can be designed.

Since one of the features of the madistor is the isolation of the input from the output, it is advantageous to reduce the inductive coupling between the output current of the diode circuit and the input to the magnetic field coil current. To prevent the flux due to diode current from linking the input coils, in FIGURE 1 the return lead 10 of diode 11 is passed through air gap 12 parallel to diode 11. By doubling back one diode lead so it is adjacent to the diode in the air gap but its current flows in the opposite direction to the current flow through the diode, the inductive coupling between madistor output and input has been reduced. With such construction, the coefficient of coupling and feedback becomes negligible and the madistor can be considered a unilateral device. In madistors having more complicated geometry and output circuits, the total current in the madistor semiconductor material can remain constant independent of input, thereby completely eliminating feedback due to inductive coupling.

From the foregoing discussion, at liquid nitrogen temperature the negative resistance phenomenon is larger for high base resistivity and for diode geometry in which the base thickness is large. The formation of a solid state plasma, accompanied by an abrupt drop in voltage and the negative resistance region, is found to occur at current levels which produce a high density of injected carriers and minority carrier trap saturation. The high sensitivity to the presence of magnetic fields is shown to be a consequence of the effect of the magnetic field in the diode base to deflect the plasma into regions of low lifetime or to the surface, either of which processes will cause the diode resistance to increase. It is noted that the crystal structure of InSb is such that the energy band gap is too small for operation above 100° K. However, there are other semiconductor materials such as InAs or $HgCd_xTe_{(1-x)}$ with wider band gaps which may possess at room temperature the high mobility required to obtain high magnetic sensitivity. Hence, it is expected that devices similar to those described above may be found to be operative at room temperature or even higher.

Having thus described the invention, it will be apparent that numerous modifications to suit various applications may be made by those skilled in the art without departing from the scope contemplated by the invention. Hence, it is intended that all matter contained in the above description or shown in the accompanying drawings shall be interpreted as illustrative and not limiting.

What is claimed is:

1. A semiconductor control device comprising a bar of semiconductor material having a rectifying junction contact separated from an ohmic contact by a distance much longer than the minority carrier diffusion length at low injection levels, means for maintaining said bar at a temperature sufficiently low to permit minority carrier injection across said junction, an output load for said device, a power source biasing said junction for forward current flow through said load at a carrier injection density producing a plasma, a magnetic field applied transverse to the direction of current flow in said bar to deflect said plasma and means for controlling the strength of said field to control the deflection of said plasma thereby changing the resistance of said base to control the flow of current in said load.

2. A semiconductor control circuit comprising a bar of semiconductor material having a rectifying contact separated from a pair of spaced ohmic contacts by a distance much longer than the minority carrier diffusion length at low injection levels, means for maintaining said bar at a temperature which permits carrier injection at a level producing a solid state injection plasma zone in said bar and a forward current-voltage characteristic exhibiting negative resistance, an output load for each of said ohmic contacts, a power source to bias said device for forward current flow at a carrier injection level forming a solid state plasma zone in said bar, a magnetic field applied transverse to the direction of current flow through said bar to deflect said plasma zone, and means for controlling the direction and strength of said magnetic field to deflect said plasma zone from one of said pair of ohmic contacts to the second of said pair of ohmic contacts to control the current flow in each of said loads.

3. A semiconductor control device comprising a bar of semiconductor material having a rectifying contact separated from a pair of spaced ohmic contacts by a distance much longer than the minority carrier diffusion length at low injection levels, means for maintaining said bar at a temperature which permits carrier injection at a level producing a solid state injection plasma zone in said bar and a forward current-voltage characteristic exhibiting negative resistance, an output load for each of said ohmic contacts, a direct current source connected in a circuit with said output loads to bias said device for forward current flow at a carrier injection level forming a solid state plasma zone in said bar, means for subjecting said bar to a biasing magnetic field transverse to the direction of current flow through said bar to deflect said plasma zone to a selected one of said contacts, and means for controlling the direction and strength of said magnetic field to deflect said plasma zone from said selected ohmic contact to the second of said pair of ohmic contacts to control the current flow in each of said loads.

4. A semiconductor control circuit comprising a slab of semiconductor material having a rectifying junction contact at one end and a plurality of ohmic contacts spaced along said slab at a distance from said rectifying contact which is very large compared to the minority carrier diffusion length at low injection levels, means for maintaining said slab at a temperature which permits carrier injection at a level producing a solid state plasma zone and a forward current-voltage characteristic exhibiting negative resistance, an output load for each of said ohmic contacts, a direct current power source connected to said rectifying contact and to said output loads to bias said junction for forward current flow with a carrier injection density sufficient to form a solid state injection plasma zone in said slab, means for subjecting said slab to a biasing magnetic field transverse to the direction of current flow through said device to establish current flow between said rectifying contact and a selected one of said ohmic contacts, and means for varying said magnetic field strength to change the flow of current from said selected ohmic contact to any other of said plurality of ohmic contacts.

5. A semiconductor control device comprising a bar of semiconductor material having a rectifying junction contact separated from a pair of spaced ohmic contacts by a distance much longer than the minority carrier diffusion length at low injection levels, means for maintaining said bar at a temperature which permits carrier injection at a level producing a solid state injection plasma zone in said bar, an output load for each of said ohmic contacts, a power source biasing said junction for forward current flow at a carrier injection density producing a plasma, means for applying a magnetic field to said bar in a direction and at a strength to deflect said plasma zone to a selected one of said pair of ohmic contacts, said pair of ohmic contacts being spaced apart to eliminate carrier diffusion between regions in said bar near said ohmic contacts whereby the establishment of said plasma zone between said junction contact and said selected ohmic contact sets a voltage level too low for injection breakdown between said junction contact and the second of said pair of ohmic contacts permitting the removal of said field without changing the current flow in said output loads established by said field, and means for reversing the direction of said field to deflect said plasma zone to the second of said pair of ohmic contacts to switch the current from one of said output loads to the other.

6. A semiconductor control device comprising a slab of semiconductor material having a rectifying junction contact separated from a pair of spaced ohmic contacts by a distance much longer than the minority carrier diffusion length at low injection levels, means for maintaining said slab at a temperature which permits carrier injection at a level producing a solid state plasma zone in said slab and a forward current-voltage characteristic exhibiting negative resistance, an output load for each of said ohmic contacts, a direct current source connected in a circuit with said output loads to bias said junction for forward current flow at a carrier injection level across said junction contact producing a solid state injection plasma zone in said slab, means for subjecting said slab to a magnetic field transverse to the direction of current flow through said slab to deflect said plasma zone to a selected one of said pair of ohmic contacts, said ohmic contacts being spaced apart to eliminate carrier diffusion between regions in said slab near said contacts, whereby the establishment of said plasma zone between said rectifying contact and one of said pair of ohmic contacts sets a voltage level across said device in accordance with said characteristic too low to cause injection breakdown between said rectifying contact and the second of said pair of ohmic contacts thereby permitting removal of said field without changing the current flowing in said output loads, and means for controlling the direction and strength of said magnetic field for a time interval to deflect said plasma zone from said one of said pair of ohmic contacts to the second of said pair to switch the current from one of said output loads to the other.

7. A semiconductor control device comprising a slab of semiconductor material having a rectifying junction contact separated from a plurality of spaced ohmic contacts by a distance much longer than the minority carrier diffusion length at low injection levels, means for maintaining said slab at a temperature which permits carrier injection at a level producing a solid state plasma and a forward current-voltage characteristic exhibiting negative resistance, an output load for each of said ohmic contacts, a direct current source connected in a circuit with said output loads to bias said junction for forward current flow at a carrier injection level across said junction contact producing a solid state injection plasma zone in said slab, means for subjecting said slab to a magnetic field transverse to the direction of current flow through said slab to deflect said plasma zone to a selected one of said plurality of ohmic contacts, said ohmic contacts being spaced apart to eliminate carrier diffusion between regions in said slab near said contacts, whereby the establishment of said plasma zone between said rectifying contact and one of said plurality of ohmic contacts sets a voltage level across said device in accordance with said characteristic too low to cause injection breakdown between said rectifying contact and any other of said plurality of ohmic contacts thereby permitting removal of said field without changing the flow of current through said output loads and means for controlling the direction and strength of said magnetic field for a time interval to deflect said plasma zone from said one of said plurality of ohmic contacts to a second contact of said plurality to switch current from said output load for said selected contact to said output load for said second contact.

8. A semiconductor control device comprising a slab of p-type indium antimonide with a resistivity at 77° K. lying in the range of 30 to 100 ohm-centimeter and having a rectifying junction contact separated from a pair of spaced ohmic contacts by a distance much longer than the minority carrier diffusion length at low injection levels, means for maintaining said slab at a temperature which permits carrier injection densities producing a solid state plasma and a forward current-voltage characteristic of said junction exhibiting negative resistance, an output load for each of said ohmic contacts, a direct current source connected in a circuit with said output loads to bias said junction for forward current flow at a carrier injection level across said junction contact producing a solid state injection plasma zone in said slab, means for subjecting said slab to a magnetic field transverse to the direction of current flow through said slab to deflect said plasma zone to a selected one of said pair of ohmic contacts, said ohmic contacts being spaced apart to eliminate carrier diffusion between regions in said slab near said contacts, whereby the establishment of said plasma zone between said rectifying contact and one of said pair of ohmic contacts sets a voltage level across said device in accordance with said characteristic too low to cause injection breakdown between said rectifying contact and the second of said pair of ohmic contacts thereby permitting removal of said field without changing the flow of current through said output loads, and means for controlling the direction and strength of said magnetic field for a time interval to deflect said plasma zone from said one of said pair of ohmic contacts to the second of said pair to switch current from one output load to the other.

9. A semiconductor control device comprising a slab of p-type indium antimonide with a resistivity at 77° K. lying in the range of 30 to 100 ohm-centimeters and having a rectifying junction contact separated from a plurality of spaced ohmic contacts by a distance much longer than the minority carrier diffusion length at low injection levels, means for maintaining said slab at a temperature which permits minority carrier injection densities producing a solid state plasma and a forward current-voltage characteristic exhibiting negative resistance, an output load for each of said ohmic contacts, a direct current source connected in a circuit with said output loads to bias said junction for forward current flow at a carrier injection level across said junction contact producing a solid state injection plasma zone in said slab, means for subjecting said slab to a magnetic field transverse to the direction of current flow through said slab to deflect said plasma zone to a selected one of said plurality of ohmic contacts, said ohmic contacts being spaced apart to eliminate carrier diffusion between regions in said slab near said contacts, whereby the establishment of said plasma zone between said rectifying contact and one of said plurality of ohmic contacts sets a voltage level across said device in accordance with said characteristic too low to cause injection breakdown between said rectifying contact and any other of said plurality of ohmic contacts thereby permitting removal of said field without changing the flow of current through said output loads and means for controlling the direction and strength of said magnetic field for a time interval to deflect said plasma zone from said one of said plurality of ohmic contacts to a second contact of said plurality to switch current from said output load for said selected contact to said output load for said second contact.

10. An amplifier comprising a semiconductor diode having a rectifying junction contact spaced from an ohmic contact by a base region having a high ratio of thickness to minority carrier diffusion length at low injection levels, means for maintaining said diode at a temperature permitting carrier injection and the formation of a solid state injection plasma, an output load and a direct current power source connected to bias said diode for forward current flow with a carrier injection density at said junction producing a plasma zone in said base region, a magnetic field applied transverse to the direction of current flow in said base to deflect said plasma, and means for varying the strength of said magnetic field, thereby changing the resistance of said base region and the current flow in said load.

11. An amplifying circuit comprising, a semiconductor diode having a bar shaped base region with a rectifying junction contact and an ohmic contact at opposite ends thereof, the thickness of said diode being very large compared to the minority carrier diffusion length, means for maintaining said diode at a temperature permitting carrier injection levels producing a solid state plasma and a forward current-voltage characteristic with a negative resistance region, a direct current source, as output load, means for biasing said diode through said load from said source for forward current flow to inject carriers at said junction with a density sufficient for the formation of a solid state injection plasma zone in said base, thereby changing a zone in said base region from a state of high resistance to a state of low resistance, means for subjecting said diode to a biasing magnetic field transverse to the direction of current flow through said base to establish a quiescent current flow through said diode at a predetermined level, and means for varying said magnetic field strength in accordance with an input signal to change the flow of current through said diode and said load.

12. An amplifying circuit, including, an output load in the circuit, a semiconductor diode in the circuit having a bar shaped base with a rectifying junction contact and an ohmic contact on opposite ends thereof, the thickness of said base between said contacts being substantially greater than the minority carrier diffusion length at low carrier injection levels, means for maintaining said diode at a sufficiently low temperature for carrier injection levels producing a solid state plasma to provide a negative resistance region in the diode current-voltage characteristic, a voltage source in said circuit of polarity and magnitude to bias said diode for forward current flow with a carrier injection density at said junction sufficient for the formation of a solid state injection plasma zone in said base, and means for applying a magnetic field transverse to the direction of current in the base to deflect said plasma zone thereby changing the resistance of said base and the current flow to said load.

13. An amplifying circuit, including, an output load in the circuit, a semiconductor diode having a high resistivity bar shaped base region of p-type indium antimonide with a resistivity at 77° K. lying in the range of 30 to 100 ohm-centimeter, said diode base region having a rectifying junction contact and an ohmic contact on opposite ends thereof, the distance between said contacts being much longer than the minority carrier diffusion length at low injection levels, a voltage source in said circuit polarized to bias said diode for forward current flow with a carrier injection density at said junction sufficient for the formation of a solid state plasma zone in said base, means for maintaining said diode in liquid nitrogen to produce a solid state injection plasma and a negative resistance region in the diode forward current-voltage characteristic, means for applying a biasing magnetic field transverse to the direction of current flow to set the quiescent current flow through said diode at a desired level, and means for varying the strength of said field in accordance with an input signal to change the current flow to said load in accordance with the change of diode resistance with said field strength.

14. An oscillating circuit, including, an output load in the circuit, a semiconductor diode having a high resistivity bar shaped base region of p-type indium antimonide with a resistivity at 77° K. lying in the range of 30 to 100 ohm-centimeter, said diode base region having a rectifying junction contact and an ohmic contact on opposite ends thereof, the distance between said contacts being much longer than the minority carrier diffusion length at low injection levels, a voltage source in said circuit polarized to bias said diode for forward current flow with a carrier injection density at said junction sufficient for the formation of a solid state plasma zone in said base, means for maintaining said diode at a temperature which permits carrier injection densities at a level for solid state plasma formation to produce a negative resistance region in the diode forward current-voltage characteristic, means for applying a biasing magnetic field transverse to the direction of current flow to set the quiescent current flow through said diode at a desired level, and means for varying the strength of said field in accordance with current variations in said output load to produce sustained oscillations in said output load.

15. A semiconductor flip-flop circuit comprising a bar of semiconductor material having a rectifying junction contact separated from a pair of spaced ohmic contacts by a distance much longer than the carrier diffusion length at low injection levels, said spaced ohmic contacts being separated to eliminate carrier diffusion between regions in said bar adjacent said contacts, means for maintaining said bar at a temperature which permits carrier injection levels producing a solid state injection plasma, an output load connected to each of said ohmic contacts, a direct current power source biasing said junction for forward current flow at a carrier injection density causing the formation of a solid state plasma zone in said bar with a current-voltage characteristic having a negative resistance region, a source of current pulses, an electromagnet arranged to apply a magnetic field to said bar transverse to the direction of current flow therein for the purpose of deflecting said plasma zone to a selected one of said pair of ohmic contacts, whereby the establishiment of said plasma zone between said junction contact and said selected ohmic contact sets a voltage level according to said characteristic too low for injection breakdown between said junction contact and the second of said pair of ohmic contacts and provides a low impedance path to said selected ohmic contact and a high impedance path to said second ohmic contact which is retained after removal of the field, and means for energizing said electromagnet from said pulse source to deflect said plasma zone alternately from one ohmic contact to the other to switch the current between said output loads in response to said pulses.

16. A semiconductor stepping switch comprising a slab of semiconductor material having a plurality of ohmic contacts spaced around the periphery thereof and separated from a rectifying junction contact located at the center of said slab by a distance much longer than the minority carrier diffusion length at low injection levels, said spaced ohmic contacts being separated to eliminate carrier diffusion between regions in said slab adjacent to said ohmic contacts, means for holding said slab at a temperature permitting carrier injection densities producing the formation of a solid state injection plasma, an output load circuit for each of said ohmic contacts, a direct current source connected to bias said junction for forward current flow at a carrier injection density forming a plasma zone in said slab with a current-voltage characteristic exhibiting negative resistance between said junction contact and a selected ohmic contact, the establishment of said plasma zone setting a voltage level according to said characteristic too low for injection breakdown between said junction contact and any other of said plurality of ohmic contacts and hence a low impedance path to said selected contact and high impedance paths to all other ohmic contacts, a source of current pulses, an electromagnet arranged to apply a magnetic field to said slab transverse to the direction of current flow therein, and means for energizing said electromagnet by a pulse from said source to deflect said plasma zone from said first selected ohmic contact to any one of the other ohmic contacts selected by polarity, duration and amplitude of said pulse whereby said low impedance path is switched to said last selected contact.

17. A semiconductor ring counter comprising a slab of semiconductor material having a plurality of ohmic contacts spaced around the periphery thereof and separated from a rectifying junction contact located at the center of said slab by a distance much longer than the minority carrier diffusion length at low injection levels, said ohmic contacts being spaced apart to eliminate carrier diffusion between regions in said slab adjacent to said ohmic contacts, means for holding said slab at a temperature permitting carrier injection densities producing the formation of a solid state injection plasma, an output load circuit for each of said ohmic contacts, a direct current source connected to bias said junction for forward current flow at a carrier injection density forming a plasma zone in said slab with a current-voltage characteristic exhibiting negative resistance between said junction contact and a selected ohmic contact, the establishment of said plasma zone setting a voltage level according to said characteristic too low for injection breakdown between said junction contact and any other of said plurality of ohmic contacts and hence a low impedance path to said selected contact and high impedance paths to all other ohmic contacts, a source of pulses to be counted, an electromagnet arranged to apply a magnetic field to said slab transverse to the direction of current flow therein, and means for energizing said electromagnet from said source to deflect said plasma zone from said first selected ohmic contact to the next adjacent ohmic contact whereby said low impedance path is shifted to each of said plurality of ohmic contacts in succession for successive pulses and the pulse count is indicated by the load circuit thereby connected in a low impedance path.

References Cited in the file of this patent

UNITED STATES PATENTS

| | | |
|---|---|---|
| 2,944,167 | Matare | July 5, 1960 |
| 2,974,236 | Pankove | Mar. 7, 1961 |
| 2,979,668 | Dunlap | Apr. 11, 1961 |
| 3,048,797 | Linder | Aug. 7, 1962 |

OTHER REFERENCES

International Dictionary of Physics and Electronics, Van Nostrand, 1961, 2nd ed. (page 871 relied on), copy in P.O. Scientific Library.